(12) United States Patent
Chin et al.

(10) Patent No.: US 7,005,317 B2
(45) Date of Patent: Feb. 28, 2006

(54) CONTROLLED FRACTURE SUBSTRATE SINGULATION

(75) Inventors: Oi Fong Chin, Butterworth (MY); Yew Wee Cheong, Penang (MY); Weng Khoon Mong, Penang (MY)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 10/695,244

(22) Filed: Oct. 27, 2003

(65) Prior Publication Data

US 2005/0101109 A1    May 12, 2005

(51) Int. Cl.
*H01L 21/44*   (2006.01)
*H01L 21/301*  (2006.01)

(52) U.S. Cl. .................. 438/106; 438/110; 438/113; 438/460; 438/463

(58) Field of Classification Search ............. 438/106, 438/110, 113, 460, 463, 464
See application file for complete search history.

(56) References Cited

U.S. PATENT DOCUMENTS 6,429,506 B1 *   8/2002   Fujii et al. ............... 257/620
6,596,562 B1     7/2003   Maiz \* cited by examiner

*Primary Examiner*—Hsien-Ming Lee
(74) *Attorney, Agent, or Firm*—Schwabe, Williamson & Wyatt, P.C.

(57) ABSTRACT

Methods and apparatus for separating dice from a substrate are described herein.

24 Claims, 9 Drawing Sheets

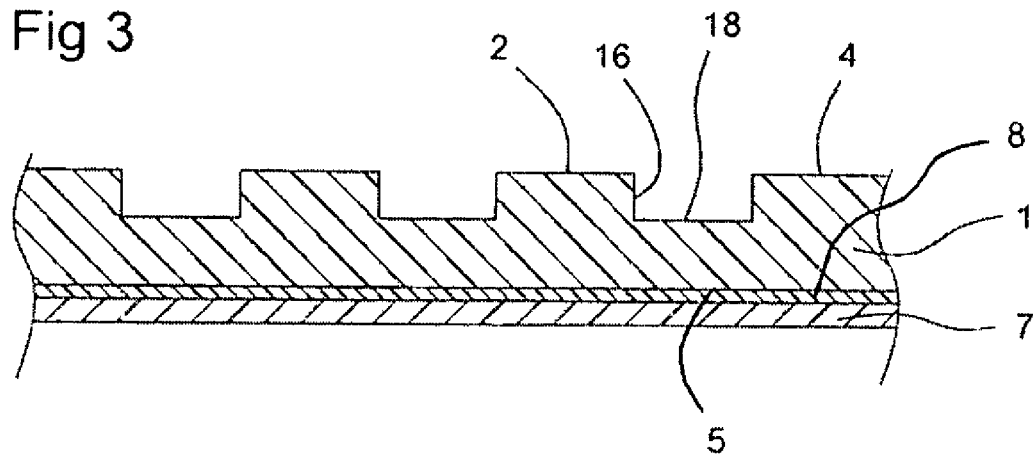
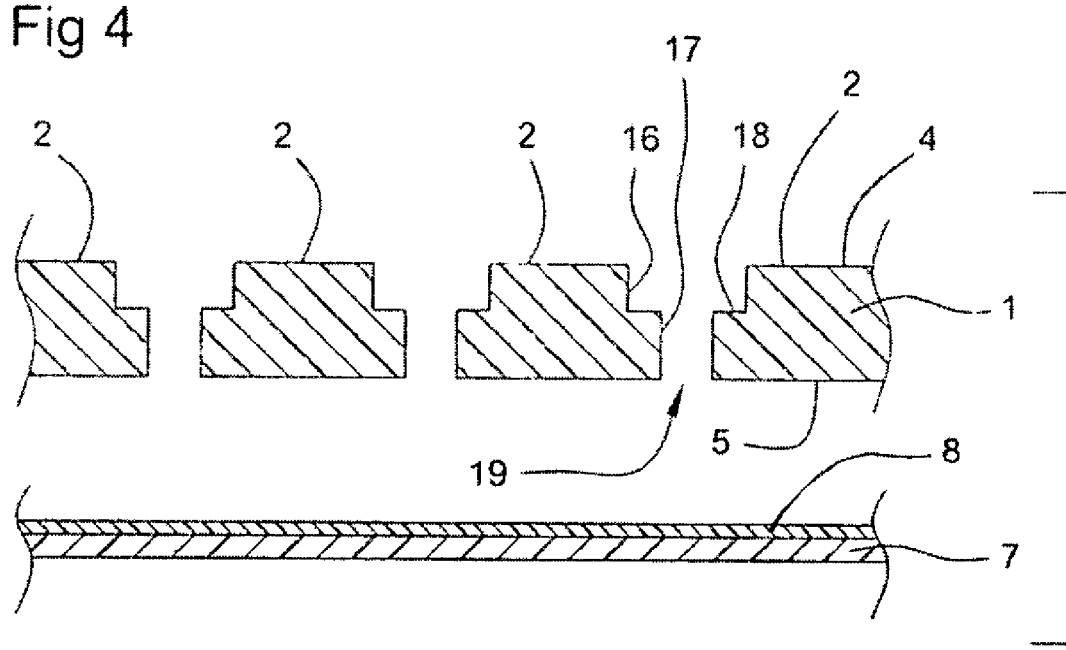

CONTROLLED FRACTURE SUBSTRATE SINGULATION

FIELD OF THE INVENTION

The present invention relates to microelectronic die fabrication and, more particularly, to methods and apparatus for singulating multiple microelectronic die from a substrate.

BACKGROUND OF INVENTION

Micro-components, such as, but not limited to, microelectronic, micro-optoelectronic, and microelectromechanical systems (MEMS), share a common fabrication technology comprising the use of a substrate from which the micro-component is formed referred to as a die. Various techniques, such as layering, doping, masking, and etching, are used to build thousands and even millions of microscopic devices on and from the substrate. For example, a microelectronic die may have integrated circuit (IC) devices in the form of transistors, resistors, and others. The IC devices are interconnected to define a specific electronic circuit that performs a specific function, such as the function of a microprocessor or a computer memory.

Commonly, a plurality of die are simultaneously formed on a single substrate and subsequently separated into individual die. Examples of substrates include, among others, wafers comprising silicon (Si), gallium arsenide (GaAs), Indium Phosphate (InP), and their derivations. The die 2 are commonly formed on a die side 4 opposite a base side 5 of the substrate 1 in an array of horizontal and vertical rows, as shown in a perspective view in FIG. 1. An active area 3 is the portion of the die 2 that contains the micro-components. The active areas 3 are separated by streets 6. It is along the streets 6 that the die 2 are separated at some point in the fabrication process. The width of the streets 6 depends, in part, on the substrate material, further handling constraints, and the particular separation process used to separate, or singulate, the dice 2.

A number of methods are used to singulate each die 2. In one method, the dice 2 are separated from the substrate 1 by a process referred generally as sawing. Sawing involves the use of mechanical abrasion and/or erosion of the substrate 1 along the streets 6. Sawing may be achieved using a saw blade 10 driven by a rotary saw 9 (as illustrated in FIG. 2), or other techniques such as a vibrating stylus with a sharpened tip (not shown). The base side 5 of the substrate 1 is commonly mounted to dicing tape 7 having adhesive layer 8 to hold the dice 2 as they are being sawed to prevent die fly-away, as shown in cross-section in FIG. 3. The dicing tape 7 is commonly mounted to a saw frame (not shown). Sawing commonly is a two step process of providing a pre-cut 16 into the die side 4 and subsequently a through-cut 17, as shown as a cross-sectional exploded view in FIG. 4.

Sawing requires substantial post-separation processing to restore the dice 2 to a specified state of cleanliness. The act of sawing produces substantial debris which includes small pieces of the substrate 1 and possibly small pieces of the sawing implement, such as the saw blade 10 or vibrating tip. Also, the adhesive layer 8 must be removed from the base side 5. Cooling/lubricating fluid is another source of contamination. Special precautions, sometimes involving substantial processing steps, are commonly used to clean the singulated dice 2 and/or to protect the active area 3 before the sawing process. MEMS devices are particularly vulnerable to contamination as they incorporate mechanical components.

Another method used to singulate the dice 2 involves using a focused beam 15 from a laser 11 to ablate through the substrate 1 along the streets 6, as shown in FIG. 2. A beam 12 from the laser 11 is processed using mirrors 13 and lenses 14 to concentrate and position the focused beam 15. Issues, such as those related to the buildup of heat and process complexity and control, must be addressed.

Another method used to singulate the dice 2 involves a combination of grooving the active side 4 and fracturing through the thickness of the substrate 1 along a groove 18. Grooving refers to any process in which the streets 6, usually the die side 4, are provided with a groove 18 having a predetermined depth into the thickness of the substrate 1, as shown in FIGS. 2 and 3. Grooving is commonly done using a method such as sawing, such as with a pre-cut 16, using a laser 11, and scratching or scribing using a pointed stylus, among others. Commonly, the substrate 1 is mounted with dicing tape 7 to a saw frame (not shown).

A number of fracture methods are used to break the substrate 1 along the grooves 18. In one method, while mounted in the saw frame and provided on the dicing tape 7, the substrate 1 is caused to form fractures 19 by urging the base side 5 against a cylinder to flex or bow the substrate 1 to initiate fracture from the grooves 18 (FIGS. 3 and 4). The grooves 18 provide a point of crack initiation to form the fracture 19 that extend through the substrate 1.

In some of the current fracture methods, the substrate 1 must be removed from the saw frame in order to urge the substrate 1 against the cylinder. This removal from the saw frame and the actual fracturing of the substrate 1 is difficult to provide in an automated production process, leading to inefficiencies, longer lead times, and added cost.

As the drive for smaller and thinner die 2 continues, substrate 1 and corresponding active and passive device layers on and within the substrate 1 are being made thinner. For example, materials having a low dielectric constant (k) that can be made very thin are being investigated for use as inter-level dielectric (ILD) material. As the k is lowered, the ILD can be made thinner for the same electrical performance as one that is thicker with a higher k. The resulting smaller and thinner dice 1 are especially prone to die fly-off from the dicing tape 7 during singulation due, in part, to the decreased surface area of the smaller die 1 available to adhere to the dicing tape 7. Die fly-off causes high die yield loss and damage to the dicing equipment.

Further, the increased fragility of the thinner, low-k ILD requires more prudent handling to prevent unintentional fracture, cracking, and delamination, that can be caused by the current singulation methods.

BRIEF DESCRIPTION OF DRAWINGS

FIG. 3 is a cross-sectional view of the substrate with grooving/pre-cuts;

FIG. 4 is a cross-sectional exploded view of the substrate with through-cuts/fracture;

DESCRIPTION OF EMBODIMENTS

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Methods and apparatus are provided in accordance with embodiments of the present invention for separating die from a substrate. The substrate may be mounted on a diaphragm that is adapted to bow under the influence of fluid pressure. The bowing causes the substrate to fracture along the streets between the dice. Fracture initiation may be facilitated by providing grooves in the streets on a side of the substrate opposite the side that is to receive a positive fluid pressure. Fracture also occurs as the diaphragm expands under the influence of the fluid pressure on the side of the substrate opposite the grooved side, inducing bending forces along the grooves sufficient to cause fracture and thus, die separation. The singulated die, for example, among others, are subsequently processed, coupled to a carrier substrate and packaged into a microelectronic package.

Figure 5:
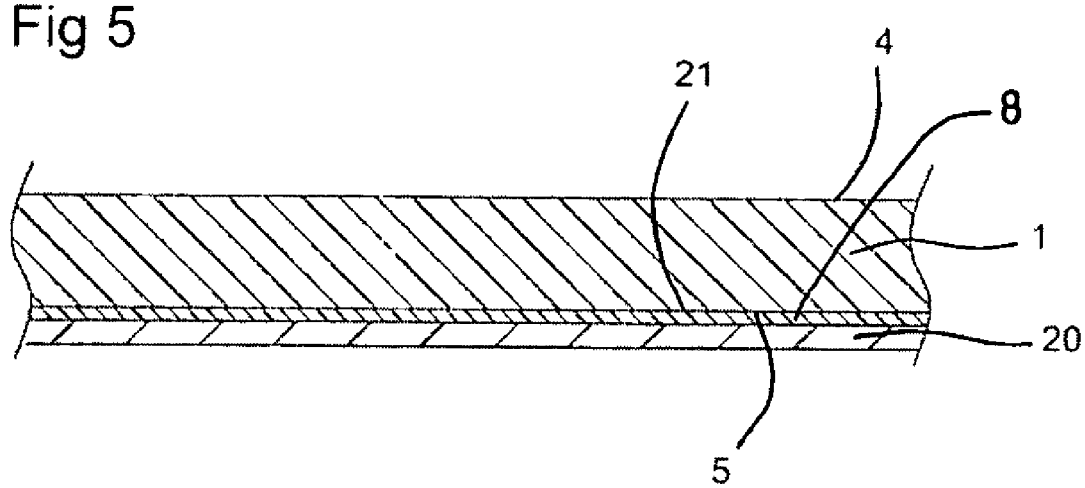
FIG. 5 is a cross-sectional view of the substrate coupled to a diaphragm, in accordance with an embodiment of the invention.

FIG. 5 is a cross-sectional view of the substrate 1 having one side coupled to a diaphragm 20 with an adhesive layer 8, in accordance with an embodiment of the method of the present invention. The diaphragm 20 comprises a material that has the property of bowing under a pressure force applied to one side. Suitable materials include, but are not limited to, those that are flexible, plastically deformable, and elastically deformable. Embodiments in accordance with the present invention illustrating the use of diaphragms of these materials will be provided below by way of example.

In one embodiment in accordance with the present invention, a diaphragm 20 comprises an elastic material capable of being substantially uniformly stretched. Examples of suitable materials include, but are not limited to, polymer and stretchable fabric. The base side 5 of the substrate 1 is coupled to the diaphragm 20 with an adhesive layer 8 there between. The adhesive layer 8 comprises a material having predetermined properties suitable for the particular purpose of coupling the substrate 1 to the diaphragm 20 during the singulation process, and being removable from the base side 5 after the singulation process. Suitable adhesive includes, but is not limited to, those adhesives found on common dicing tape used in substrate sawing processes.

Figure 1:
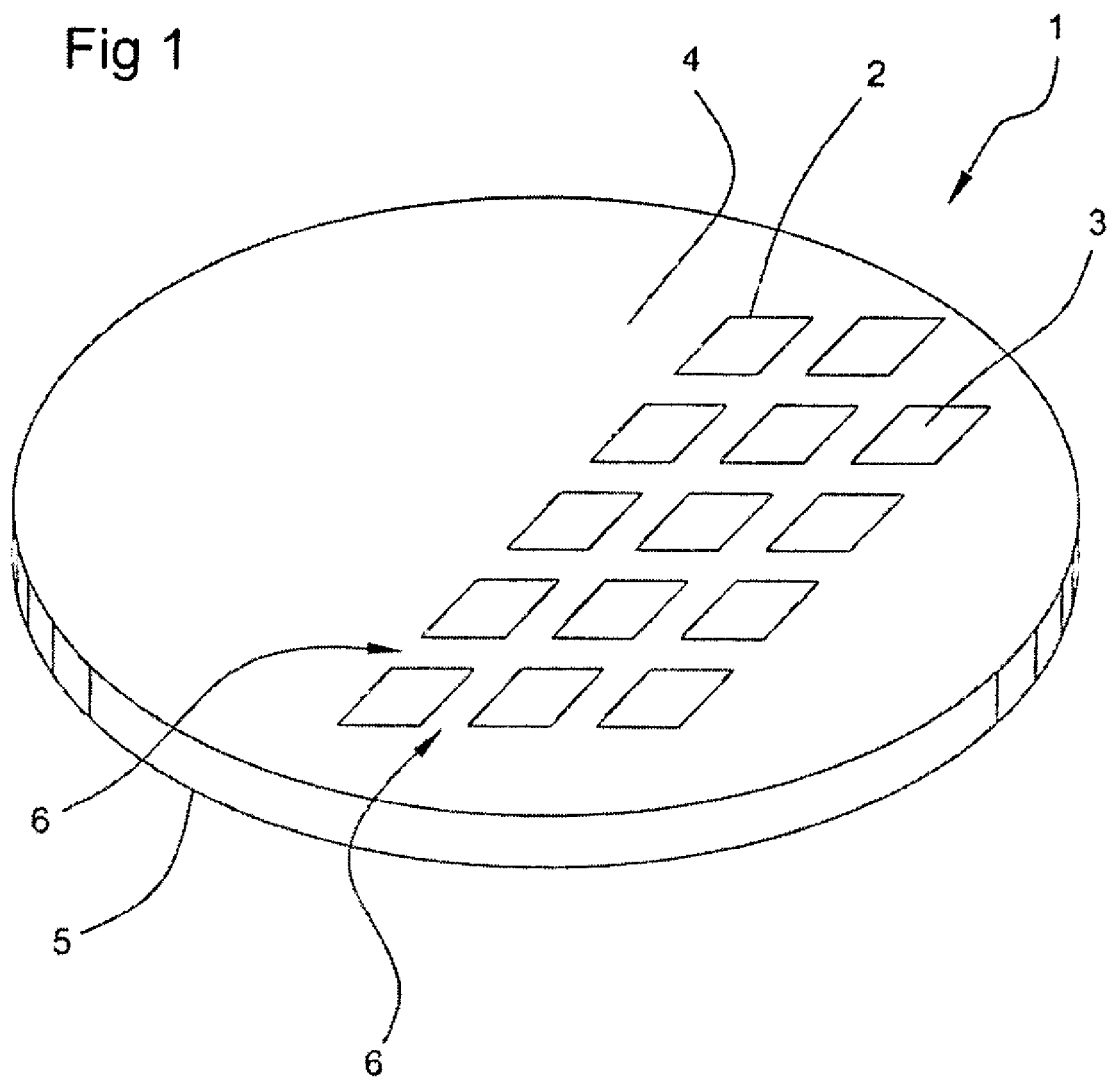
FIG. 1 is a perspective view of a substrate.
Figure 2:
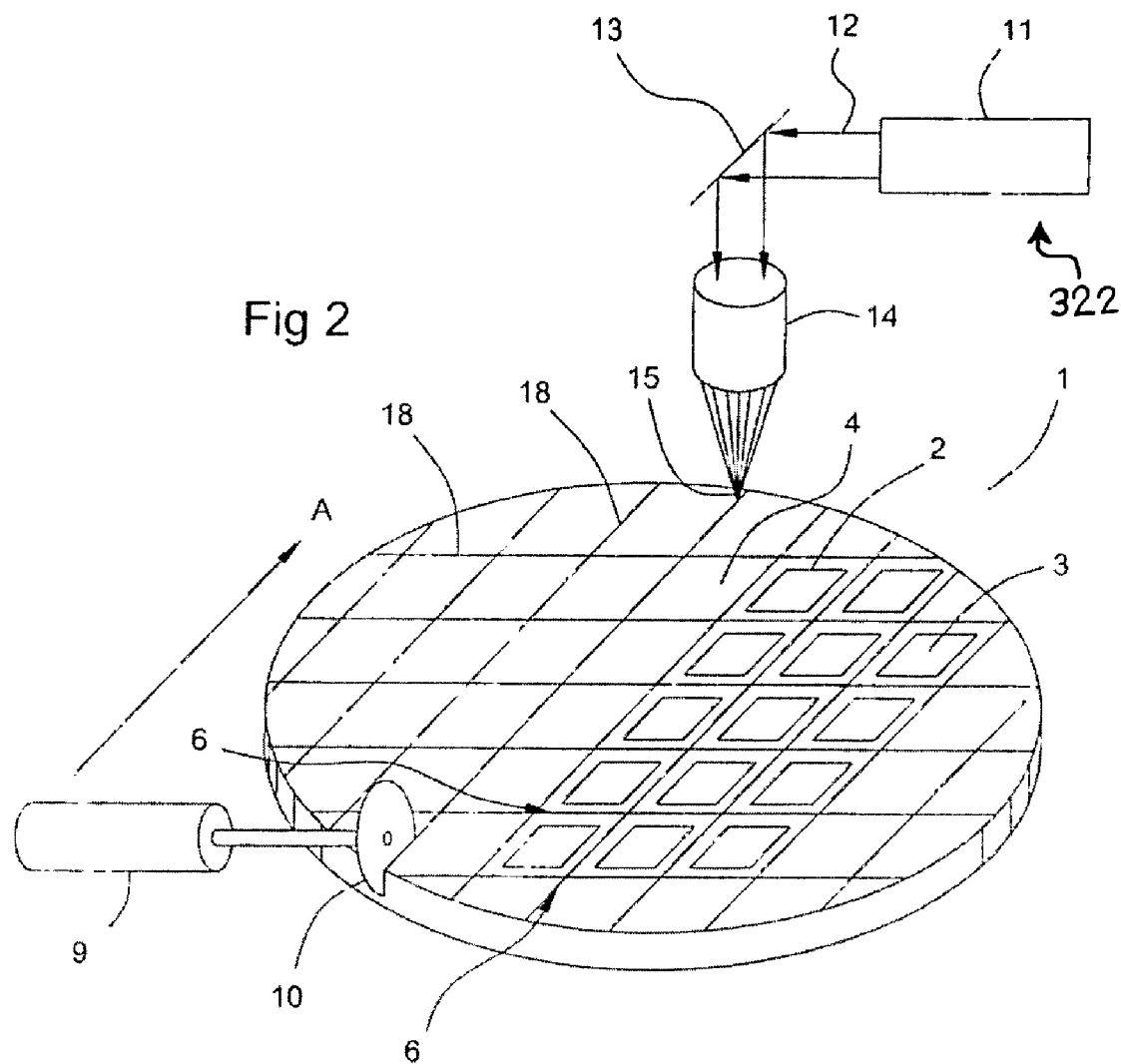
FIG. 2 is a perspective view of the substrate undergoing singulation.
Figure 6:
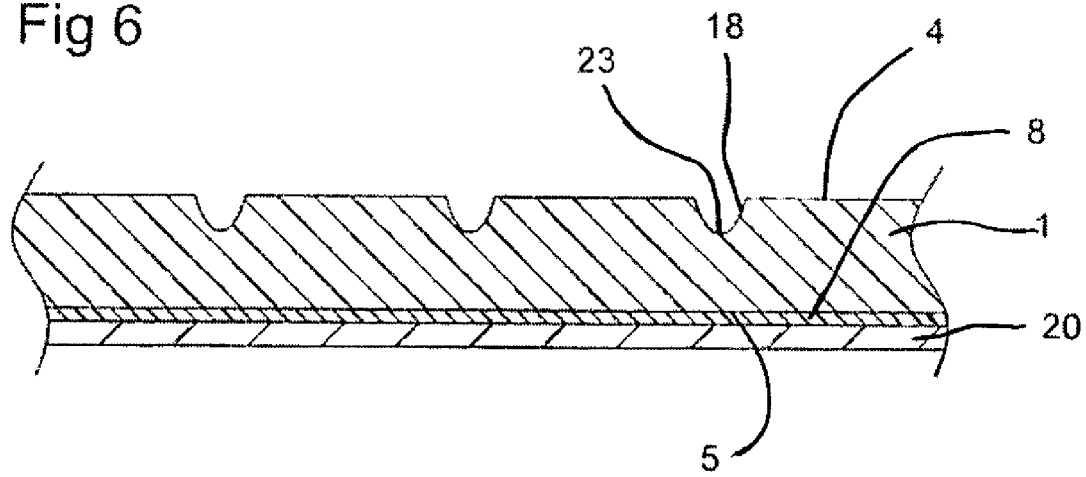
FIG. 6 is a cross-sectional view of the substrate provided with grooves, in accordance with an embodiment of the invention.

FIG. 6 is a cross-sectional view of the substrate provided with grooves 18 as provided by a grooving process, in accordance with embodiments of methods of the present invention. The die side 4 may be provided with grooves 18 having a groove base 23 along the streets 6 of the substrate 1, as shown in FIG. 2. The grooves 18 may be provided on the die side 4 using a process suitable for the particular purpose of providing grooves 18 having a predetermined depth into the thickness of the substrate 1. Suitable methods include, but are not limited to, sawing, such as associated with a pre-cut 16, in accordance with FIG. 3, using a laser 11, and scratching or scribing using a pointed stylus, among others.

The depth of the grooves 18 may be predetermined for the particular purpose of creating a fracture initiation line while leaving the substrate 1 as a whole. The depth of the grooves 18, that is needed for fracture initiation under a given loading condition, will depend on many factors, such as, but not limited to, the substrate material, substrate thickness, and/or die dimensions. By way of example, a substrate 1 comprising a material that has a low fracture resistance will not require as deep a groove 18 to effect fracture. The effect of the shape of the groove 18 is discussed below.

The substrate 1 need not be coupled to the diaphragm 20 during the grooving process, but may be. The die 2 are not singulated by the grooving process and therefore, the diaphragm 20 is not needed as a mechanism for retaining the singulated dice 2, but may be. The grooving process can be performed with the substrate 1 retained by an alternative means, such as, but not limited to, a wafer chuck and vacuum table.

Figure 7:
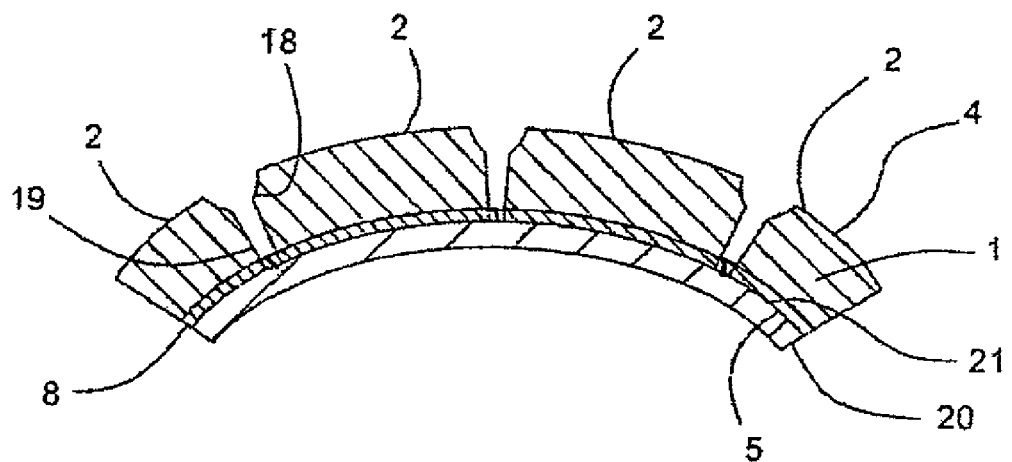
FIG. 7 is a cross-sectional view of the substrate under bending load, in accordance with an embodiment of the invention.

FIG. 7 is a cross-sectional view of the substrate 1 and diaphragm 20 as bowed under the influence of a fluid pressure. The bowing of the diaphragm 20 creates a predetermined bending stress at the groove base 23 as the dice 2 are influenced to move in different directions by the fluid pressure. The bending stress is sufficient to cause fracture initiation at the groove base 23 and subsequent fracture 19 through the thickness of the substrate 1 along the grooves 18.

Figure 8:
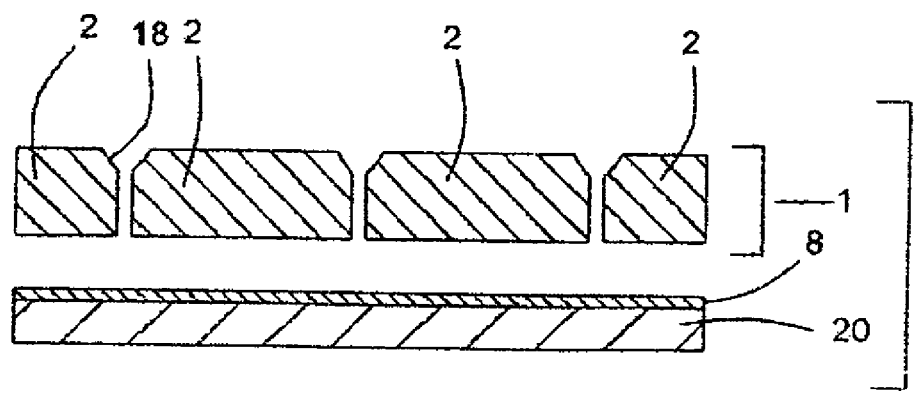
FIG. 8 is a cross-sectional view of the singulated dice, in accordance with another embodiment of the invention.

FIG. 8 is a cross-sectional exploded view of the substrate 1 having undergone the fracturing process to singulate the dice 2. In subsequent processing of the dice 2, the dice 2 remain coupled to the diaphragm 20 to facilitate handling, or are subsequently removed from the diaphragm 20 for processing each die 2 separately.

Figure 9:
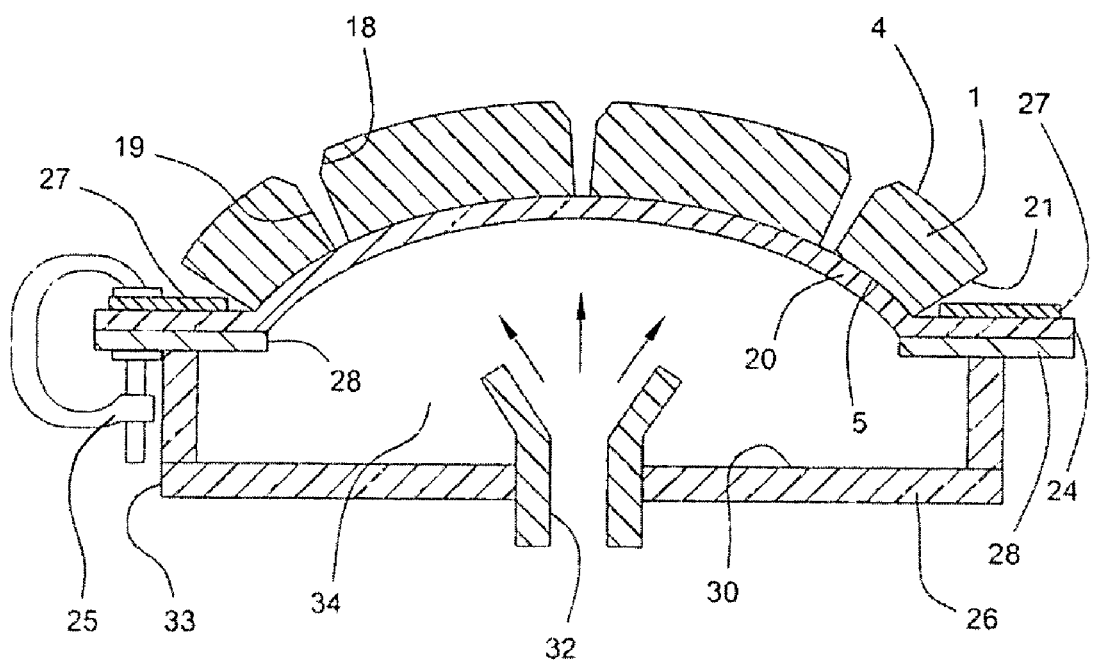
FIG. 9 is a cross-sectional view of the substrate coupled to a diaphragm that itself is mounted to a pressure frame, in accordance with an embodiment of the invention.

The fluid pressure may be provided against the diaphragm 20 in any method and apparatus suitable for the particular purpose. FIG. 9 is a cross-sectional view of the substrate 1 coupled to a central portion of the diaphragm 20, wherein the diaphragm 20 is coupled to a pressure frame 26, in accordance with embodiments of methods and apparatus of the present invention. The pressure frame 26 comprises a base plate 33, pressure port 32, and a mounting flange 28. The mounting flange 28 extends a predetermined distance from the base plate 33. The pressure port 32 may be adapted to couple with a pressure source (not shown).

The mounting flange 28 may be adapted to provide a fluid tight seal with the diaphragm 20. The diaphragm 20 may be provided with a perimeter tab 24 extending beyond the substrate 1 adjacent to and around a perimeter edge 21 of the substrate 1. The perimeter tab 24 and mounting flange 28 are adapted for cooperative in fluid tight engagement about the perimeter edge 21 of the substrate 1.

The perimeter tab 24 and mounting flange 28 may be provided in fluid tight engagement using any method and/or apparatus suitable for the particular purpose. In one embodiment in accordance with the present invention, the perimeter tab 24 and mounting flange 28 are coupled using a circular ring 27 and one or more clamps 25 for clamping engagement therewith. Other embodiments of methods and apparatus suitable for the purpose are appreciated and numerous, including, but not limited to, a circular press 29 as shown in FIG. 10, a perimeter clip, and adhesive.

The diaphragm 20 and pressure frame 26 define a fluid pressure-containing cavity 30 in fluid communication with the pressure port 32. The pressure port 32 is coupled to a pressure source (not shown) adapted to provide a fluid pressure differential between the cavity 30 and ambient. Fluid pressure may be provided to the cavity 30 from the fluid source (not shown) in the form of a fluid 34 including, but not limited to, a liquid and/or gas. The fluid 34 provided to the cavity 30 is adapted to be compatible with the material from which the diaphragm 20 is made.

Figure 10:
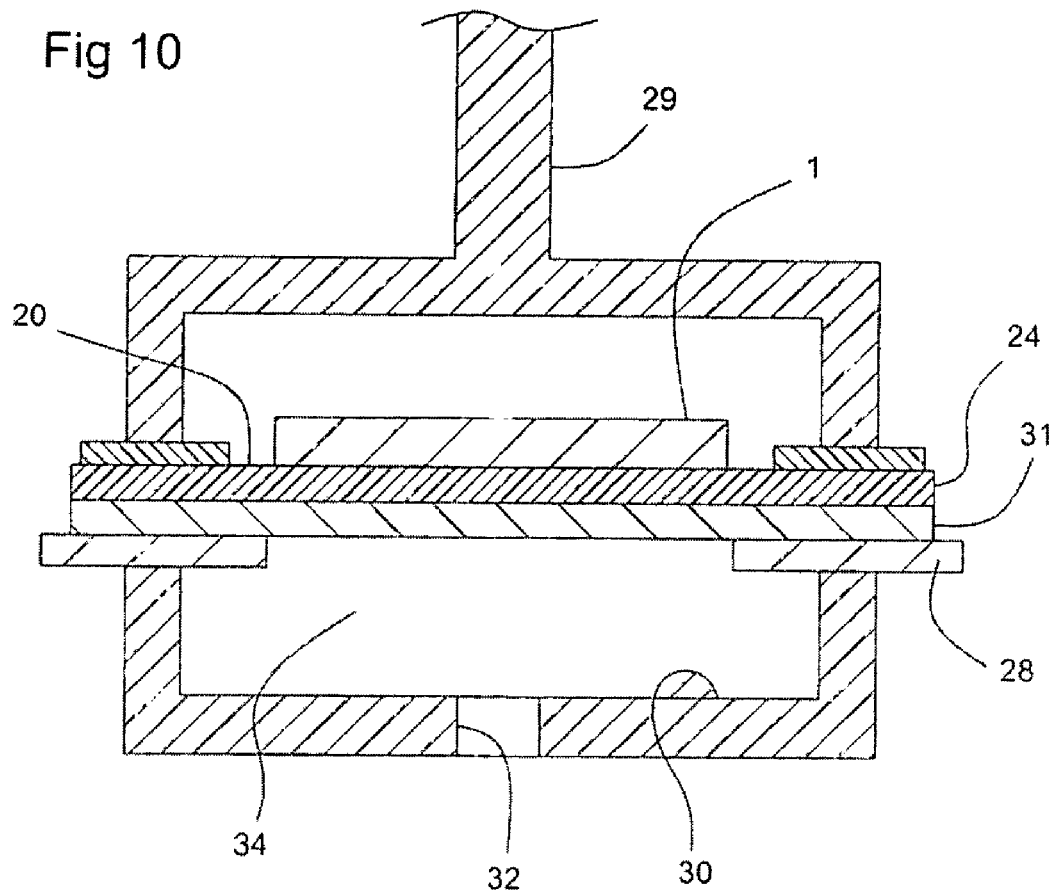
FIG. 10 is a cross-sectional view of a press apparatus for engaging the diaphragm and pressure frame for fluid-tight engagement there between, in accordance with an embodiment of the invention.

It is anticipated that where the fluid 34 is not compatible with the material from which the diaphragm 20 is made, the fluid 34 and diaphragm 20 are separated by a bladder 31, as shown in cross-section in FIG. 10. The bladder 31 may be adapted to permit the diaphragm 20 to bow under applied fluid pressure.

Figure 11:
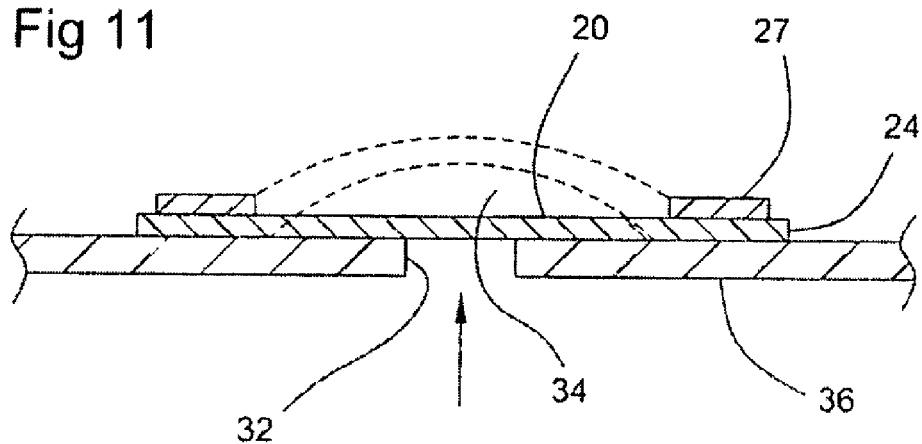
FIG. 11 is a cross-sectional view of a pressure frame in the form of a perforated plate, in accordance an embodiment of the invention.

Other embodiments of apparatus suitable for the particular purpose provided by the pressure frame 26 are appreciated and numerous. FIG. 11 is a cross-sectional view of a plate 36 comprising one or more pressure ports 32 in fluid communication with a fluid pressure source (not shown), in accordance with another embodiment of the invention. A positive fluid pressure may be applied to the one or more pressure ports 32 causing the diaphragm 20 to bow away from the plate 36, defining a fluid cavity 34 there between.

The response of the diaphragm 20 to the applied fluid pressure is dependent, in part, on the material from which the diaphragm 20 is made. A flexible material that is resistant to stretching, such as, but not limited to, a tight-weave fabric, will bow under the influence of the fluid pressure in parachute-like fashion to an extent depending, in part, upon the amount of slack in the material provided in the perimeter tab 24. Increasing the slack, or reducing the tautness, of the diaphragm 20 when mounted in the pressure frame 26, for example, will permit a more pronounced bowing, and therefore a greater bending about the groove 18 for inducing fracture.

A material that has a greater ability to stretch, such as, but not limited to, a loose-weave fabric, will permit a more pronounced bowing and, if not substantially elastic, will leave the diaphragm 20 in an extended state. The material will expand under the influence of the fluid pressure providing not only a bending load caused by the bowing of the diaphragm 20, but also a pulling-apart, or additional tensile loading between the dice 2, providing, therefore, a greater loading on the groove 18 for inducing fracture.

A material having a dual property of being both stretchable and substantially elastic, such as, but not limited to, some rubbers and polymeric materials, will bow and expand under the influence of the fluid pressure as described above, and return to substantially the original state upon pressure release. The property of elasticity allows for the diaphragm 18 to substantially return to an original state that was prior to the application of fluid pressure, which offers the potential for re-pressurizing in instances wherein all the dice 2 have not singulated and/or reusability with another substrate.

The response of the diaphragm 20 to the applied fluid pressure is also dependent, in part, on the adhesion characteristics between the diaphragm 20 material and the substrate 1. In one embodiment in accordance with the present invention, the adhesive layer 8 between the substrate 1 and the diaphragm 20 is of a substantially uniform thickness across the base side 5. Upon fracture of the substrate 1, the diaphragm 20 comprising a stretchable material, will expand at the location adjacent the fracture 19. The portion of the diaphragm 20 adhered to the now singulated die 2 is prevented from stretching by the adhesive bond with the stiff die 2, limiting the magnitude of the expansion, and thus the bowing, of the diaphragm 20.

In another embodiment in accordance with the present invention, the adhesive layer 8 may be provided adjacent the active area 3 of the substrate 1 and not adjacent the streets 6. Upon die 2 fracture, a greater portion of the diaphragm 20 adjacent the fracture 19 is free to expand, greatly increasing the magnitude of the expansion, and thus the bowing, of the diaphragm 20.

Figure 12:
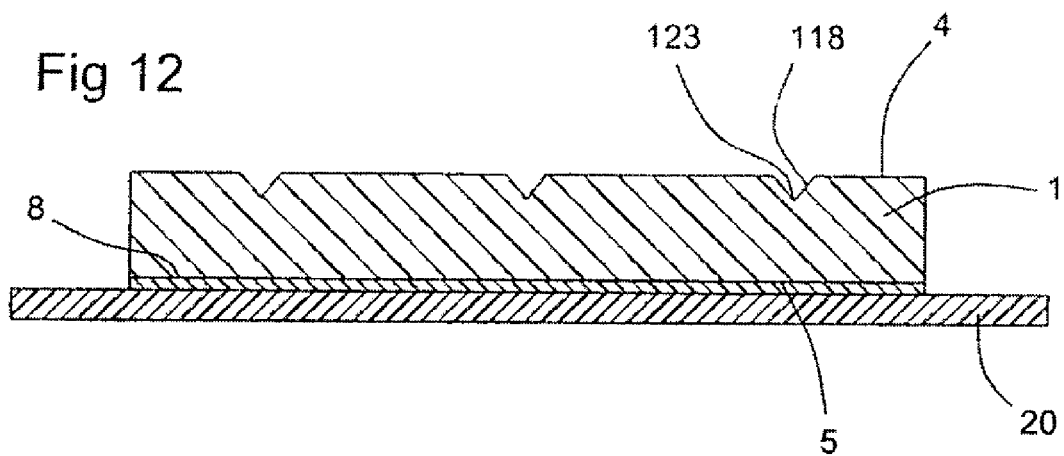
FIG. 12 is a cross-sectional view of the substrate having vee-shaped grooves, in accordance an embodiment of the invention.

As previously discussed, the resistance of the substrate 1 to fracture is dependent on many parameters, including, but not limited to, the shape of the grooves 18. Referring again to FIG. 6, the groove 18 has a groove base 23 in the form of a smooth rounded contour. FIG. 12 is a cross-sectional view showing a vee-shaped groove 118 having a vee-groove base 123 in the form of a sharp point. For some substrate 1 materials, the vee-groove base 123 has a fracture initiation resistance that is lower than for a more rounded contour.

The width and shape of the groove 18, among other properties, also effects the number of die 2 that can be produced from a given substrate 1 size. Grooves 18 that are relatively more narrow having a base 23 relatively more sharp, will, for some materials, induce a highly controlled fracture 19 that forms substantially perpendicular to the die side 4 from the groove base 23. Reducing the amount of fracture deviation away from a straight path that is perpendicular to the die side 4 from the groove base 23 will also reduce the required width of streets 6 that would be necessary to account for non-straight fractures 19. Reducing the width of the groove 18 also reduces the amount of the streets 6 that is sacrificed as a result of singulation, and therefore, the dice 2 can be placed closer together. The embodiments of the present invention enable a process that can lead to a substantially higher die density for a given substrate 1. The fracture characteristics can be controlled to provide the dice 2 with smooth edges and lower defect rate.

In one embodiment in accordance with the present invention, and shown by way of example, the substrate 1 is comprised of silicon. A silicon substrate 1 is relatively freely fractured along crystal planes. The grooves 18 (sufficiently deep to provide crystal defect) provide a controlled fracture initiation point about one of the crystal planes. It is found that for silicon, the singulation of the dice 2 occurs substantially simultaneously when provided with substantially uniform expansion of the diaphragm 20.

It is appreciated that substantially the same fracture characteristics will result for a given substrate composition, independent of which side receives the grooves 18 with the opposite side coupled to the diaphragm 18, assuming that the material properties of the substrate 1 are substantially symmetric about the center of the substrate 1 thickness. For non-symmetric substrate compositions, the fracture characteristics will be different depending on which side receives the grooves 18.

Figure 13:
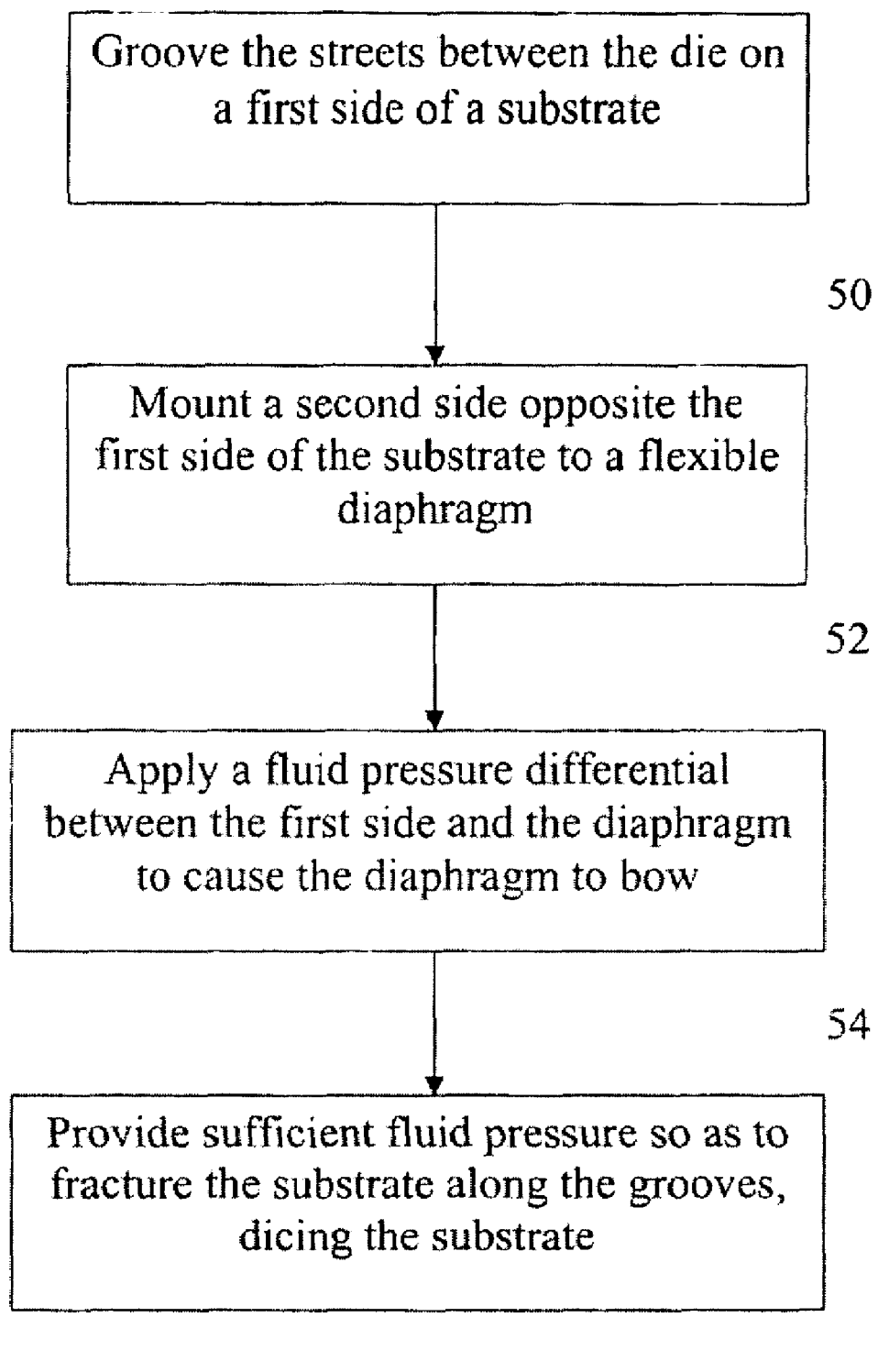
FIG. 13 is a flow chart of an exemplary embodiment of the method of the present invention.

FIG. 13 is a flow chart of an exemplary embodiment of the method of the present invention. The streets 6 on one side of the substrate are provided with a groove 18 between the die 2. 50 A second side of the substrate opposite the first side is coupled to a flexible diaphragm. 52 A fluid pressure differential between the first side and the diaphragm is applied to urge the diaphragm to bow. 54 Sufficient fluid pressure is provided to cause fracture along the grooves and dicing the substrate. 56

Referring again to FIG. 2, in one embodiment of the methods in accordance with the present invention, a high precision laser 11 may be used to form the grooves 18 in the die side 4 of the substrate 1 at a predetermined groove depth. The laser 11 can provide a significantly more narrow and precise groove 18 than mechanical cutting. The more narrow the width of the groove 18, the more usable substrate 1 is available, and thus, allowing for an increase in the number of die 2 per substrate.

The laser beam 12 from the laser 11 may be guided by a mirror 13 and focused by a lens 14, producing a focused beam 15, onto the die side 4 of the substrate 1. It is appreciated that the laser beam 12 may also be focused at a point above or below the die side 4 of the substrate 1. The focused beam 15 may be scanned across the die side 4 in a linear motion, for example, in direction A, to form the grooves 18 by ablation.

Damage to the substrate 1 caused by heat generated by the focused beam 15 is mitigated by selecting an appropriate range of laser frequencies that are strongly absorbed in the upper layers of the substrate 1, but with minimal absorption deep within the substrate 1. For example, silicon heavily absorbs (absorption coefficient of $10.^6$ cm$.^{-1}$) energy in the UV range of the spectrum, such as a laser wavelength of about 200 nm. An Excimer (LW) laser is an example of a source whose energy is readily absorbed by silicon.

In an exemplary embodiment of the present invention, the focused beam 15 may be about 50 um in diameter, although other diameters may be used as necessary. In one embodiment, the focused beam 15 may be stationary while the substrate 1 is moved in direction A, for example, using a conventional X-Y table (not shown) onto which the substrate 1 is carried (by vacuum for example), to form grooves 18. As each groove 18 is completed, the substrate 1 may be translated in an orthogonal direction by the X-Y table and the process is repeated for an additional groove 18. After all of the grooves 18 in one direction are formed, the substrate 1 may be rotated substantially by 90 degrees, and the process repeated. Alternatively, the laser assembly 322 and/or the optics, may be moved relative to a stationary substrate 1 in either or both the X and Y directions.

One major advantage of using the laser 11 for grooving the substrate 1 is that laser grooving can be performed at a much higher feed rate than mechanical methods, with grooving velocities about 600 mm/sec being obtainable with current technology. This is about an order of magnitude greater than achievable with mechanical methods.

Embodiments in accordance with the present invention provide methods for singulating die that are likely to have a lower risk of producing fractures that can render the resulting die 2 defective and also reducing the potential for die fly-off problems as experienced with conventional mechanical singulation. This is especially pronounced wherein the substrate comprises the relatively fragile low k ILD substrates.

The aforementioned die separation methods are likely to be useful for separating relatively small die 2 comprised of a very thin substrate 1. Additionally, the methods enable singulation of the substrate 1 having die 2 of various sizes and shapes, enabling cost effective multiple-die processing from a single substrate 1. Existing laser and mechanical technology and equipment can be used with the mentioned advantages for the laser 11 as described. Further, the processing apparatus can be reused, such as, but not limited to, the pressure frame, and the diaphragm 20.

A potentially substrate-damaging UV heating process is not required for adhesive cure, as a high temperature adhesive is not required using the methods of the present invention. Further, the controlled fracture process is inherently clean as compared with liquid-cooled mechanical cutting. The laser-produced grooves 18 do not need to be deep, or need cooling fluid.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for singulating dice from a substrate comprising:
    forming a groove in a first side of the substrate between adjacent dice;
    coupling a second side of the substrate opposite the first side to a flexible diaphragm; and
    applying a fluid pressure differential between the first side and the diaphragm sufficient to cause the diaphragm to bow and cause substrate fracture along the grooves forming singulated dice.

2. The method of claim 1 wherein coupling a second side to a diaphragm comprises:
    adhesively coupling a second side to a central portion of a flexible diaphragm defining a perimeter tab of the flexible diaphragm extending beyond and around a perimeter edge of the substrate; and
    coupling the tab around the perimeter edge in fluid tight engagement to a mounting flange of a pressure frame, the pressure frame and coupled diaphragm defining a cavity adapted to provide a fluid pressure differential with the ambient pressure, the pressure frame further comprising a pressure port in fluid communication with the cavity adapted to communicate with a fluid pressure source.

3. The method of claim 2 wherein coupling the tab around the perimeter edge comprises coupling the tab around the perimeter edge, the substrate being exterior to the cavity.

4. The method of claim 3 wherein applying a fluid pressure differential comprises raising the fluid pressure in the cavity above the ambient pressure exterior to the cavity causing the diaphragm to outwardly bow.

5. The method of claim 1 wherein coupling a second side of the substrate to a flexible diaphragm comprises:
    coupling a second side of the substrate to a diaphragm comprising elastic properties wherein the diaphragm returns to substantially an original state upon withdrawal of the fluid pressure differential.

6. The method of claim 1 wherein forming the grooves in a first side of the substrate between adjacent dice comprises:
aiming and scanning a laser beam across a first substrate side between adjacent dice, the laser beam having sufficient energy for forming the grooves through ablation.

7. The method of claim 1 wherein forming the grooves in a first side of the substrate between adjacent dice comprises:
scribing across the first side between adjacent dice.

8. The method of claim 7 wherein scribing is a process selected from the group consisting of:
moving a selected one of a vibrating needle, a non-vibrating needle, a grinding bit, and a blade against the first side so as to form the grooves thereon; and
cutting into the first side using a rotating or reciprocating saw blade to form the grooves thereon.

9. The method of claim 1 further comprising:
removing the singulated dice from the flexible diaphragm.

10. The method of claim 1 wherein raising the fluid pressure in the cavity above the ambient pressure exterior to the cavity comprises:
filling the cavity with a fluid at an elevated pressure relative to the ambient pressure exterior to the cavity, the fluid selected from a group consisting of liquid and gas.

11. The method of claim 1 wherein forming one or more the grooves in a first side of the substrate between adjacent dice comprises:
forming the grooves in a first side of the substrate between adjacent dice sufficient to form crystal defects within the substrate, sufficient to form a location for fracture initiation to facilitate fracture about a crystal plane.

12. The method of claim 1 wherein:
forming the grooves in a first side of the substrate between adjacent dice comprises aiming and scanning a laser beam across a first substrate side between adjacent dice, the laser beam having sufficient energy for forming the grooves through ablation;
coupling a second side of the substrate opposite the first side to a flexible diaphragm comprises, adhesively coupling a second side to a central portion of a flexible diaphragm defining a perimeter tab of the flexible diaphragm extending beyond and around a perimeter edge of the substrate;
wherein coupling the tab around the perimeter edge in fluid tight engagement to a mounting flange of a pressure frame, the pressure frame and coupled diaphragm defining a cavity adapted to provide a fluid pressure differential with the ambient pressure, the pressure frame further comprising a pressure port in fluid communication with the cavity adapted to communicate with a fluid pressure source; and
wherein applying a fluid pressure differential between the first side and the diaphragm sufficient to cause the diaphragm to bow and cause substrate fracture along the grooves forming singulated die comprises raising the fluid pressure in the cavity above the ambient pressure exterior the cavity causing the diaphragm to outwardly bow.

13. A microelectronic device packaging method, comprising:
forming a groove in a first side of a substrate between adjacent dice;
coupling a second side of the substrate opposite the first side to a flexible diaphragm;
applying a fluid pressure differential between the first side and the diaphragm sufficient to cause the diaphragm to bow and cause substrate fracture along the grooves forming singulated dice;
removing the singulated dice from the diaphragm; and
interconnecting at least one die onto a carrier substrate.

14. The method of claim 13 wherein coupling a second side to a diaphragm comprises:
adhesively coupling a second side to a central portion of a flexible diaphragm defining a perimeter tab of the flexible diaphragm extending beyond and around a perimeter edge of the substrate; and
coupling the tab around the perimeter edge in fluid tight engagement to a mounting flange of a pressure frame, the pressure frame and coupled diaphragm defining a cavity adapted to provide a fluid pressure differential with the ambient pressure, the pressure frame further comprising a pressure port in fluid communication with the cavity adapted to communicate with a fluid pressure source.

15. The method of claim 14 wherein coupling the tab around the perimeter edge comprises coupling the tab around the perimeter edge, the substrate being exterior to the cavity.

16. The method of claim 15 wherein applying a fluid pressure differential comprises raising the fluid pressure in the cavity above the ambient pressure exterior to the cavity causing the diaphragm to outwardly bow.

17. The method of claim 13 wherein coupling a second side of the substrate to a flexible diaphragm comprises:
coupling a second side of the substrate to a diaphragm comprising elastic properties wherein the diaphragm returns to substantially an original state upon withdrawal of the fluid pressure differential.

18. The method of claim 13 wherein forming the grooves in a first side of the substrate between adjacent dice comprises:
aiming and scanning a laser beam across a first substrate side between adjacent dice, the laser beam having sufficient energy for forming the grooves through ablation.

19. The method of claim 13 wherein forming the grooves in a first side of the substrate between adjacent dice comprises:
scribing across the first side between adjacent dice.

20. The method of claim 19 wherein scribing is a process selected from the group consisting of:
moving a selected one of a vibrating needle, a non-vibrating needle, a grinding bit, and a blade against the first side so as to form the grooves thereon; and
cutting into the first side using a rotating or reciprocating saw blade to form the grooves thereon.

21. The method of claim 13 further comprising:
removing the singulated dice from the flexible diaphragm.

22. The method of claim 13 wherein raising the fluid pressure in the cavity above the ambient pressure exterior the cavity comprises:
filling the cavity with a fluid at an elevated pressure relative to the ambient pressure exterior to the cavity, the fluid selected from the group consisting of liquid and gas.

23. The method of claim 13 wherein forming the grooves in a first side of the substrate between adjacent die comprises:
forming the grooves in a first side of the substrate between adjacent dice sufficient to form crystal defects within the substrate, sufficient to form a location for fracture initiation to facilitate fracture about a crystal plane.

24. The method of claim 13 wherein:

forming the grooves in a first side of the substrate between adjacent dice comprises aiming and scanning a laser beam across a first substrate side between adjacent dice, the laser beam having sufficient energy for forming the the groove through ablation;

coupling a second side of the substrate opposite the first side to a flexible diaphragm comprises adhesively coupling a second side to a central portion of a flexible diaphragm defining a perimeter tab of the flexible diaphragm extending beyond and around a perimeter edge of the substrate;

wherein coupling the tab around the perimeter edge in fluid tight engagement to a mounting flange of a pressure frame, the pressure frame and coupled diaphragm defining a cavity adapted to provide a fluid pressure differential with the ambient pressure, the pressure frame further comprising a pressure port in fluid communication with the cavity adapted to communicate with a fluid pressure source; and wherein applying a fluid pressure differential between the first side and the diaphragm sufficient to cause the diaphragm to bow and cause substrate fracture along the grooves forming singulated die comprises raising the fluid pressure in the cavity above the ambient pressure exterior to the cavity causing the diaphragm to outwardly bow.

* * * * *

UNITED STATES PATENT AND TRADEMARK OFFICE
CERTIFICATE OF CORRECTION

PATENT NO. : 7,005,317 B2
APPLICATION NO. : 10/695244
DATED : February 28, 2006
INVENTOR(S) : Oi Fong Chin et al.

It is certified that error appears in the above-identified patent and that said Letters Patent is hereby corrected as shown below:

Column 2
Line 9, "...active side 4..." should read --...die side 4...--.
Lines 42 and 44, "...die 1..." should read --...die 2...--.

Column 5
Lines 65-66, "...diaphragm 18..." should read --...diaphragm 20...--.

Column 6
Line 62, "...diaphragm 18..." should read --...diaphragm 20...--.

Column 8
Line 39, "...the grooves..." should read --...the groove...--.

Column 9
Lines 1, 5, 7, 16, 28, 30, 35, 38-39, and 58, "...the grooves..." should read --...the groove...--.

Column 9
Lines 27-28, "...wherein forming one or more the grooves..." should read --...wherein forming the groove...--.

Column 10
Lines 3, 35, 40, 42, 51, 53, 63, and 66, "...the grooves..." should read --...the groove...--.

Column 11
Line 4, "...the grooves..." should read --...the groove...--.

UNITED STATES PATENT AND TRADEMARK OFFICE
CERTIFICATE OF CORRECTION

PATENT NO. : 7,005,317 B2
APPLICATION NO. : 10/695244
DATED : February 28, 2006
INVENTOR(S) : Oi Fong Chin et al.

It is certified that error appears in the above-identified patent and that said Letters Patent is hereby corrected as shown below:

Column 12
Line 11, "...the grooves..." should read --...the groove...--.

Signed and Sealed this

Fifteenth Day of May, 2007

JON W. DUDAS
*Director of the United States Patent and Trademark Office*